US006639282B2

(12) United States Patent
Lee et al.

(10) Patent No.: US 6,639,282 B2
(45) Date of Patent: Oct. 28, 2003

(54) SEMICONDUCTOR DEVICE ON SILICON-ON-INSULATOR AND METHOD FOR MANUFACTURING THE SEMICONDUCTOR DEVICE

(75) Inventors: Young-ki Lee, Yongin (KR); Heon-jong Shin, Yongin (KR); Ji-woon Rim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/126,399

(22) Filed: Apr. 19, 2002

(65) Prior Publication Data

US 2003/0047781 A1 Mar. 13, 2003

(30) Foreign Application Priority Data

Sep. 10, 2001 (KR) .......................... 2001-55467

(51) Int. Cl.[7] .......................... H01L 27/01; H01L 27/12; H01L 31/0392
(52) U.S. Cl. .......................... 257/354; 257/347; 257/353
(58) Field of Search .................. 257/347, 349, 257/350, 353, 354

(56) References Cited

U.S. PATENT DOCUMENTS 5,243,213 A * 9/1993 Miyazawa et al. .......... 257/350

* cited by examiner

Primary Examiner—Ngân V. Ngô
(74) Attorney, Agent, or Firm—Mills & Onello LLP

(57) ABSTRACT

A semiconductor device on a SOI and a method for manufacturing the same are provided. The semiconductor device includes a semiconductor wafer having a SOI structure including an insulating layer having a predetermined thickness and a monocrystalline silicon layer formed on the insulating layer, an isolation insulating layer formed on the insulating layer on the semiconductor wafer, a gate comprised of a gate dielectric layer and a gate conductive layer, which are sequentially stacked on the monocrystalline silicon layer, insulating layer spacers formed at the sidewalls of the gate, and a source junction and a drain junction asymmetrically formed at either side of the gate between the isolation insulating layer spacers and the insulating layer. In the semiconductor device formed on a SOI, source and drain junctions are formed at either side of a gate to be asymmetrical, and thus a ground of a transistor is formed on the SOI, and thus the electrical characteristics of the semiconductor device are improved.

21 Claims, 6 Drawing Sheets

SEMICONDUCTOR DEVICE ON SILICON-ON-INSULATOR AND METHOD FOR MANUFACTURING THE SEMICONDUCTOR DEVICE

BACKGROUND OF THE INVENTION

1. Field of the Invention

The present invention relates to a semiconductor device formed on a silicon-on-insulator (SOI) structure and to a method for manufacturing the semiconductor device.

2. Description of the Related Art

As the integration density of semiconductor devices increases, the distance between devices continues to decrease. Accordingly, an isolation distance required to electrically isolate devices from each other becomes reduced considerably, and thus it is difficult to prevent transistor devices from interfering with each other through the use of conventional isolation methods, such as local oxidation of silicon (LOCOS) or trench isolation. For example, latch-up, which acts between adjacent transistor devices, occurs more frequently. In order to prevent transistor latch-up, ion implantation has been employed to prevent punch-through of an insulating layer for isolation. However, as the distance between devices decreases, ion implantation cannot be considered an effective approach to prevent latch-up.

Accordingly, a silicon-on-insulator (SOI) wafer has been developed to form devices completely isolated from each other, unlike a conventional method for forming a device directly on a silicon wafer. The SOI wafer includes a base comprised of a general silicon wafer and has a structure in which an insulator is formed on the silicon wafer and a monocrystalline silicon layer is formed on the insulator. That is, the SOI wafer has a three-layered structure including a base layer formed of silicon, an intermediate layer comprised of an insulator, and a top layer formed of monocrystalline silicon.

Devices are formed on the top layer of the SOI wafer, which is formed of monocrystalline silicon. If transistors are formed on the SOI wafer having such a structure, each of the transistors is formed in an island shape so that the transistor devices can be completely isolated from one another and punch-through or latch-up can be prevented.

However, transistors formed on a semiconductor wafer, each generally including three terminals including a gate, a source, and a drain, and a ground path, must be prepared in the semiconductor wafer so that the basic circuit structure of a transistor device can be completed. However, in the case of the SOI wafer, an insulator is formed under the monocrystalline silicon layer of the SOI wafer, and thus it is difficult to provide a stable ground path perforating the insulator in the SOI wafer. Therefore, electric charges generated when an external voltage is applied to devices having an island shape cannot be released. Thus, the reference voltage of a transistor becomes unstable, and the operational characteristics of a device deteriorate.

SUMMARY OF THE INVENTION

To solve the above-described problems, it is an object of the present invention to provide a semiconductor device on a SOI wafer which is capable of stably maintaining the electrical characteristics of a device, such as threshold voltage.

In accordance with the invention, there is provided a semiconductor device on a silicon-on-insulator (SOI). The device includes a semiconductor wafer having a SOI structure and including an insulating layer having a predetermined thickness and a monocrystalline silicon layer formed on the insulating layer. An isolation insulating layer is formed on the insulating layer on the semiconductor wafer. A gate comprised of a gate dielectric layer and a gate conductive layer are sequentially stacked on the monocrystalline silicon layer. Insulating layer spacers are formed at the sidewalls of the gate, and a source junction and a drain junction are asymmetrically formed at either side of the gate between the isolation insulating layer spacers and the insulating layer.

In one embodiment, the isolation insulating layer includes a silicon oxide layer. The isolation insulating layer can be a silicon oxide layer formed to fill a trench on the semiconductor wafer.

The gate conductive layer may be formed to include a silicide layer formed by allowing titanium, cobalt, or molybdenum with silicon in order to deposit impurity-doped polysilicon or increase the conductivity of the gate conductive layer.

The gate dielectric layer, which is interposed between the gate conductive layer and the monocrystalline silicon layer and controls the threshold voltage of a MOS transistor, may be a thin silicon oxide layer.

The insulating layer spacers are preferably formed of a silicon nitride layer by chemical mechanical deposition (CVD).

The semiconductor device according to the first embodiment of the present invention may further include a channel junction formed at the surface of the monocrystalline layer at either side of the gate, and thus a short channel effect can be prevented from occurring at the semiconductor device.

The drain junction may further include a reinforced drain junction formed under the drain junction.

In accordance with the invention, there is also provided a semiconductor device on a SOI, including a semiconductor wafer having a SOI structure and including an insulating layer having a predetermined thickness and a monocrystalline silicon layer formed on the insulating layer, an isolation insulating layer formed in the monocrystalline silicon layer, a gate comprised of a gate dielectric layer and a gate conductive layer, which are sequentially stacked on the monocrystalline silicon layer, first insulating layer spacers formed at the sidewalls of the gate, second insulating layer spacers formed at the sidewalls of the first insulating layer spacers, a source junction and a drain junction formed at either side of the gate between the first insulating layer spacers and the isolation insulating layer, and a reinforced drain junction formed between the second insulating layer spacers and the isolation insulating layer to extend from the lower portion of drain junction.

Here, the isolation insulating layer includes a silicon oxide layer. The isolation insulating layer is preferably formed by depositing a silicon oxide layer to fill a trench on the semiconductor wafer.

Preferably, the gate conductive layer includes a conductive polysilicon layer formed by doping polysilicon with impurities or a silicide layer formed by allowing silicon react with a metal.

In one embodiment, the gate dielectric layer, which is interposed between the gate conductive layer and the monocrystalline silicon layer and controls the electrical characteristics of a transistor including threshold voltage, is formed of a thin silicon oxide layer. However, in the case of using a thin silicon oxide layer as the gate dielectric layer, the reliability of a semiconductor device may deteriorate. Thus, the gate dielectric layer is preferably formed of a silicon oxynitride (SiON) layer.

The first insulating layer spacers may be formed of a silicon nitride layer or a silicon oxide layer, and the second insulating layer spacers may be formed of a silicon oxide layer or a silicon nitride layer. However, in the case of forming a gate of a silicide layer, the first and second insulating layer spacers are preferably formed of a silicon nitride layer because an oxide layer can be easily etched by an etchant for removing a metal used to form the silicide layer.

The semiconductor device according to the second embodiment of the present invention may further include a channel junction formed at the surface of the monocrystalline layer at either side of the gate, and thus a short channel effect can be prevented from occurring at the semiconductor device.

As described above, in the method for manufacturing a semiconductor device on a SOI wafer according to the present invention, a source and a drain are asymmetrically formed. Thus, a stable ground in a transistor can be achieved, and a semiconductor device which is capable of stably maintaining threshold voltage can be made.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein.

Figure 1:
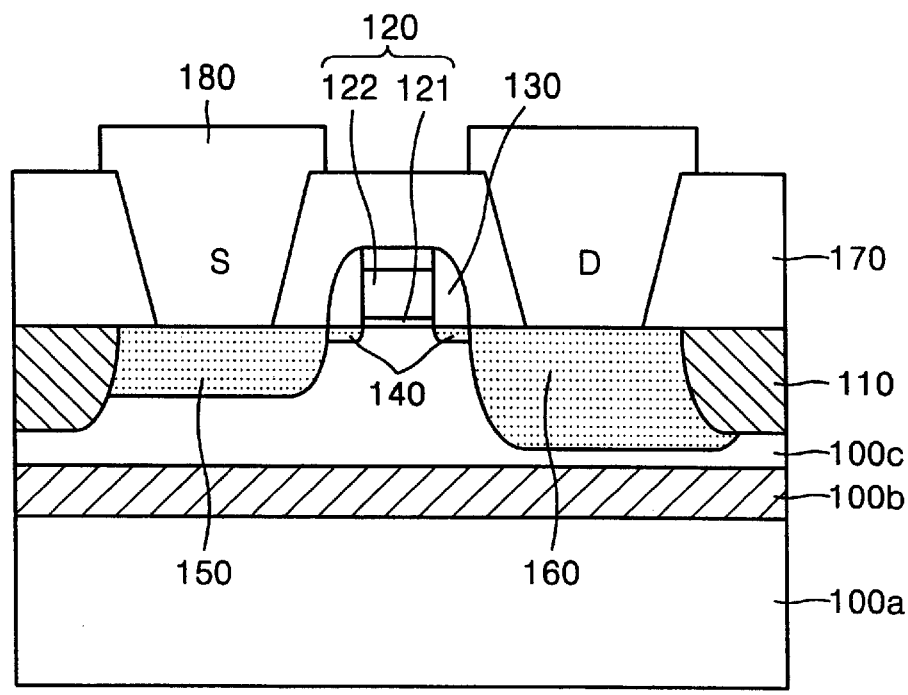
FIG. 1 is a cross-sectional view illustrating a semiconductor device formed on a SOI wafer according to a first embodiment of the present invention.

FIG. 1 is a cross-sectional view illustrating a semiconductor device formed on a SOI wafer according to the present invention. As shown in FIG. 1, a semiconductor wafer 100 having a silicon-on-insulator (SOI) structure (referred to as a SOI wafer), includes an insulator 100b formed on a silicon layer 100a and a monocrystalline silicon layer 100c formed on the insulator 100b. The semiconductor device includes an isolation insulating layer 110, which is formed on the monocrystalline silicon layer 100c to electrically isolate devices from each other and define an active region in which devices are to be formed, a gate 120, which is formed in the region defined by the insulating layer 110, insulating layer spacers 130, which are formed at the sidewalls of the gate 120, a source junction 150 and a drain junction 160, which are formed at either side of the gate 120 on the SOI wafer 100, and a reinforced drain junction 165, which is formed extending from the drain junction 160.

Various methods for manufacturing the SOI wafer 100 have been suggested. The most useful method among them is that oxygen having no less than a predetermined concentration is implanted into a semiconductor wafer using an ion implanter and then the oxygen-implanted semiconductor wafer is heat-treated so as to make the oxygen implanted into the semiconductor wafer react with silicon of the semiconductor wafer. As a result of the reaction between oxygen and silicon, a silicon oxide layer, which corresponds to the insulator 100b in the SOI wafer 100, is formed, thereby completing the SOI wafer including the silicon layer 100a, the insulator 100b, and the monocrystalline silicon layer 100c. Epitaxial lateral overgrowth (ELO) or wafer bonding may also be used to manufacture the SOI wafer 100.

The insulating layer 110 is formed of a silicon oxide layer in a trench formed on the monocrystalline silicon layer 100c. The insulating layer 110 is formed to a predetermined depth of the trench of the monocrystalline silicon layer 100c so that electrons can move along a portion of the monocrystalline silicon layer 100c between the bottom of the insulating layer 110 and the top surface of the insulator 100b and a ground can be formed. The insulating layer 110 is formed of a silicon oxide layer filling the trench formed on the monocrystalline silicon layer 100c by chemical vapor deposition (CVD).

The gate 120 includes a gate dielectric layer 121 formed on the monocrystalline silicon layer 100c, and a gate conductive layer 122 formed on the gate dielectric layer 121. The gate dielectric layer 121 is formed of a thin silicon oxide layer by making the monocrystalline silicon layer 100c react with an oxidation gas, such as $O_2$ gas or water vapor ($H_2O$). If there is need to form the gate dielectric layer 121 very thinly, an oxynitride layer formed by heat-treating a silicon oxide layer in a nitride gas atmosphere containing NO or $NO_2$ can be used as the gate dielectric layer 121. The gate conductive layer 122 may be formed of conductive polysilicon doped with impurities, such as phosphorous (P) or boron (B). Alternatively, in a case where the gate 122 is required to have a low specific resistance, the gate conductive layer 122 may be formed of polycide formed by combining polysilicon with metal silicide.

The insulating layer spacers 130 formed at the sidewalls of the gate 120 are formed of a silicon oxide layer or a silicon nitride layer. The insulating layer spacers 130 are formed to protrude on the sidewalls of the gate 120 by a predetermined width so that impurity ions used to form the source and drain junctions 150 and 160 can be prevented from being implanted into portions of the monocrystalline silicon layer covered by the insulating layer spacers 130. Accordingly, the length of a channel formed by the gate 120 between the source and drain junctions 150 and 160 can be increased as much as the width of the insulating layer spacers 130, and thus a short channel effect can be prevented.

The source junction 150 and the drain junction 160 are positioned at either side of a gate structure including the gate and the insulating layer spacers 130 in the active region defined by the isolation layer 110, on which devices will be formed. The conductivity type of impurity ions to be implanted into the source junction 150 and the drain junction 160 may be different according to the types of MOS transistors. That is, since in an NMOS region, a source and a drain are a negatve type, at least one of phosphorous (P), arsenic (As), or antimony (Sb), which have five valence electrons and can generate one electron when coupled with silicon (Si) comprising a semiconductor wafer, is implanted into the source junction 150 and the drain junction 160. On the other hand, since in a PMOS region, a source and a drain are P type, at least one of boron (B) or $BF_2$, which have three valence electrons and can generate one hole when coupled with silicon (Si), is implanted into the source junction 150 and the drain junction 160. The depth of the monocrystalline silicon layer 100c, to which the source junction 150 is formed, is the same as the depth of the monocrystalline silicon layer 100c, to which the drain junction 160 is formed, and is smaller than the depth of the isolation layer 110.

A drain junction 160 may be comprised of the drain junction 160 formed to have the same depth as the source junction 150 and the drain reinforced junction 165 formed to extend from the lower portion of the drain junction to the lower portion of the oxide layer 110. Here, the reinforced drain junction 165 may be formed to have the same ion concentration as the drain junction 160 or may be formed to have lower resistivity than the drain junction 160 by increasing the concentration of dopants. It is preferable that the reinforced drain junction 165 be formed to have higher resistivity than the drain junction 160 so as to decrease the size of a junction cap. Since the reinforced drain junction 165 is formed to extend to the lower portion of the oxide layer 110, it can effectively prevent transistor latch-up.

In addition, a channel junction 140, into which channel ions are implanted, is preferably formed under the insulating layer spacers 130 so that the electrical characteristics of a MOS transistor, such as threshold voltage $V_t$, can be effectively improved.

The semiconductor device on a SOI wafer according to the present invention is capable of stably forming a ground path of a MOS transistor and stably adjusting and maintaining the threshold voltage of the MOS transistor by asymmetrically forming the source junction 150 and the drain junction 160 to have different depths.

Figure 2:
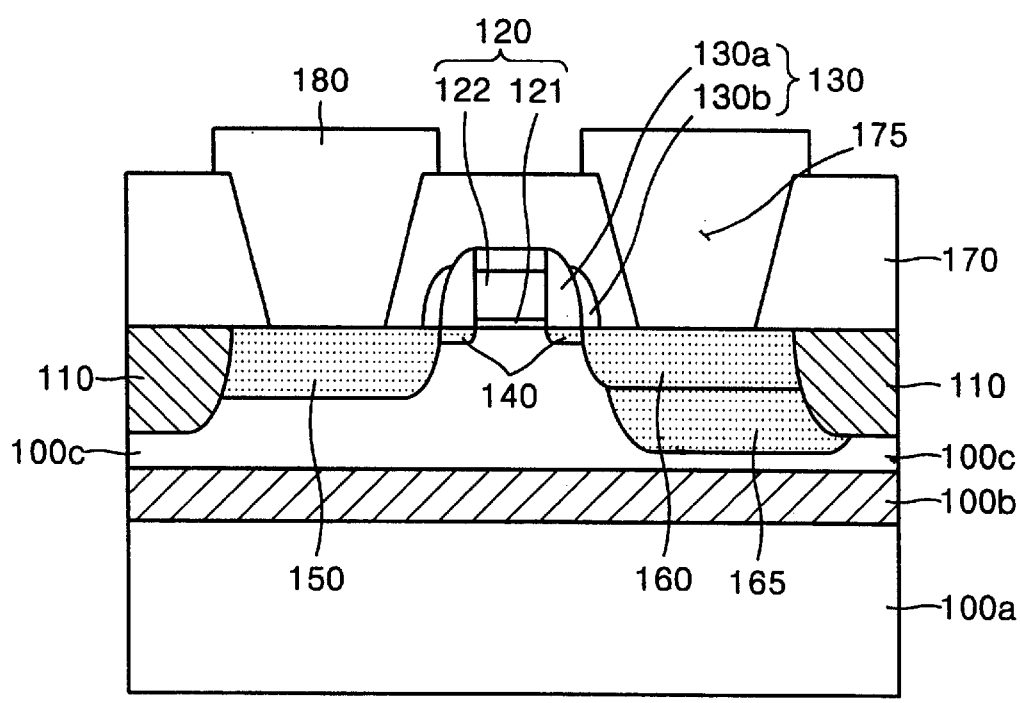
FIG. 2 is a cross-sectional view illustrating a semiconductor device formed on a SOI wafer according to a second embodiment of the present invention.

FIG. 2 is a cross-sectional view illustrating a semiconductor device formed on a SOI wafer according to a second embodiment of the present invention. Referring to FIG. 2, elements of the semiconductor device shown in FIG. 2 are the same as the corresponding elements of the semiconductor device shown in FIG. 1 except for the presence of dual insulating layer spacers 130 in the embodiment of FIG. 2. In accordance with the embodiment of FIG. 2, an insulating layer 110 is formed in a monocrystalline silicon layer 100c on a SOI wafer 100. A gate 120 comprised of a gate dielectric layer 121 and a gate conductive layer 122 is formed in a region defined by the insulating layer 110, on which devices will be formed. First insulating layer spacers 130a are formed at the sidewalls of the gate 120, and second insulating layer spacers 130b are formed on the first insulating layer spacers 130a. A source junction 150 and a drain junction 160 are arranged at either side of the gate 120 and the first insulating layer spacers 130a. A reinforced drain junction 165 is formed under the drain junction 160. The reinforced drain junction 165 may be formed by doping of elements of the same conductivity type as the drain junction 160. The elements doped in the reinforced drain junction 165 may be the same as or different from the elements doped in the drain junction 160. In the case of an NMOS transistor, arsenic (As) is doped in the drain junction 160, and phosphorus (P) is doped in the reinforced drain junction 165 under the drain junction 160. The concentration of dopants can be adjusted according to the characteristics of a semiconductor device. However, it is preferable to form the reinforced drain junction 165 to have a lower concentration than the drain junction 160 in consideration of isolation punch through.

In addition, it is preferable that a channel junction 140, into which channel ions are implanted, be preferably formed under the insulating layer spacers 130 so that the electrical characteristics of a MOS transistor, such as threshold voltage, can be effectively improved.

Figure 3:
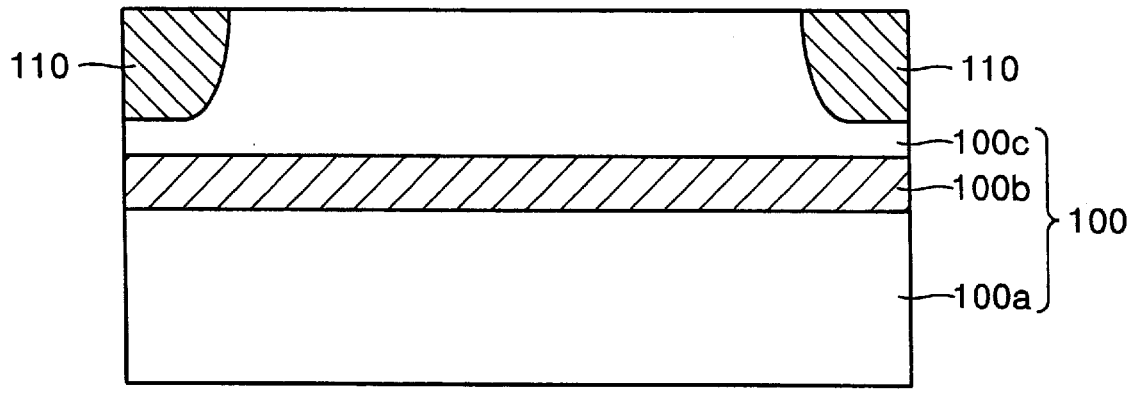
FIGS. 3 through 8 are cross-sectional views illustrating a method for manufacturing a semiconductor device according to a first embodiment of the present invention.

FIGS. 3 through 8 are cross-sectional views illustrating a method for manufacturing a semiconductor device on a SOI wafer according to the present invention. Referring to FIG. 3, a SOI wafer 100 comprised of a silicon layer 100a, an insulator 100b, and a monocrystalline silicon layer 100c is provided. An insulating layer 110 for isolation is formed in the monocrystalline silicon layer 100c, on which devices will be formed, using an isolation method. A trench is formed to a predetermined depth of the monocrystalline silicon layer 100c by photolithography and dry etching. The depth of the trench is smaller than the thickness of the monocrystalline silicon layer 100c. Next, an insulating layer is thickly deposited in the trench. The insulating layer is a silicon oxide layer deposited using chemical vapor deposition (CVD). Since the silicon oxide layer is rapidly deposited and becomes very adhesive at high temperatures, it is preferable to form the silicon oxide layer using plasma-enhanced chemical vapor deposition (PECVD). Next, the insulating layer is planarized by dry etching the entire surface of the SOI wafer 100 or chemically and mechanically polishing the insulating layer to leave the insulating layer only in the trench. Then, the insulating layer 110 is completed so that an active region, in which devices will be formed, can be defined by the insulating layer 110. Next, the surface of the monocrystalline silicon layer 100c in the region, on which devices will be formed, is exposed using a wet process, such as wet etching or wet cleaning.

Figure 4:
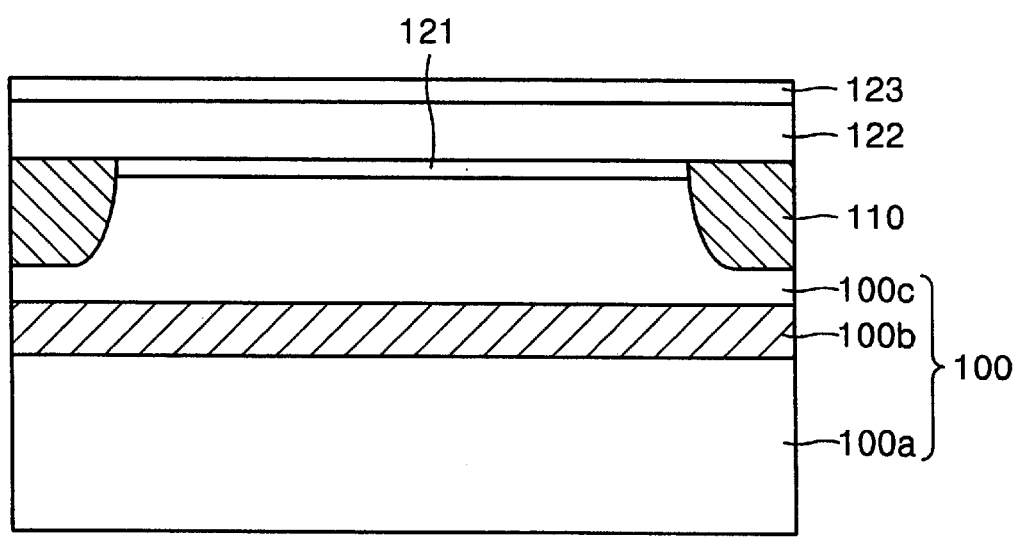

Referring to FIG. 4, a gate dielectric layer 121 is formed to a predetermined thickness on the exposed surface of the monocrystalline silicon layer 100c. The gate dielectric layer 121 may be a silicon oxide layer formed by thermally oxidizing the monocrystalline silicon layer 100c or an oxynitride (SiON) layer formed by nitrifying a silicon oxide layer. In most cases, as the integration density of devices increases, the thickness of a gate dielectric layer decreases, and thus in a case where the gate dielectric layer is a silicon oxide layer, the integrity of the gate dielectric layer is reduced. To overcome this problem, an oxynitride (SiON) layer can be used as a gate dielectric layer. The oxynitride layer may be formed by nitrifying a silicon oxide layer, which is formed by thermally oxidizing a silicon layer, using a nitrification gas, such as NO or $NO_2$, at a predetermined temperature or higher.

Next, a gate conductive layer 122 is formed on the gate dielectric layer 121. Here, the gate conductive layer 122 may be formed of phosphorous (P)-doped polysilicon or polycide, in which a silicide layer having high conductivity is deposited on polycrystalline silicon. Polycide is formed by depositing a metal, such as titanium (Ti), cobalt (Co), or molybdenum (Mo), on polysilicon using physical vapor deposition (PVD) and heat-treating the polysilicon to make the polysilicon react with the metal and thus form a silicide layer on the polysilicon. The gate conductive layer 122 is formed of polysilicon or polycide on the entire surface of the semiconductor wafer 100. Next, an insulating layer 123 is formed on the surface of the gate conductive layer 122 and may be used to prevent damage to a gate in a subsequent etching process. Alternatively, the insulating layer 123 may be used for a mask necessary to form a self-aligned contact.

Figure 5:
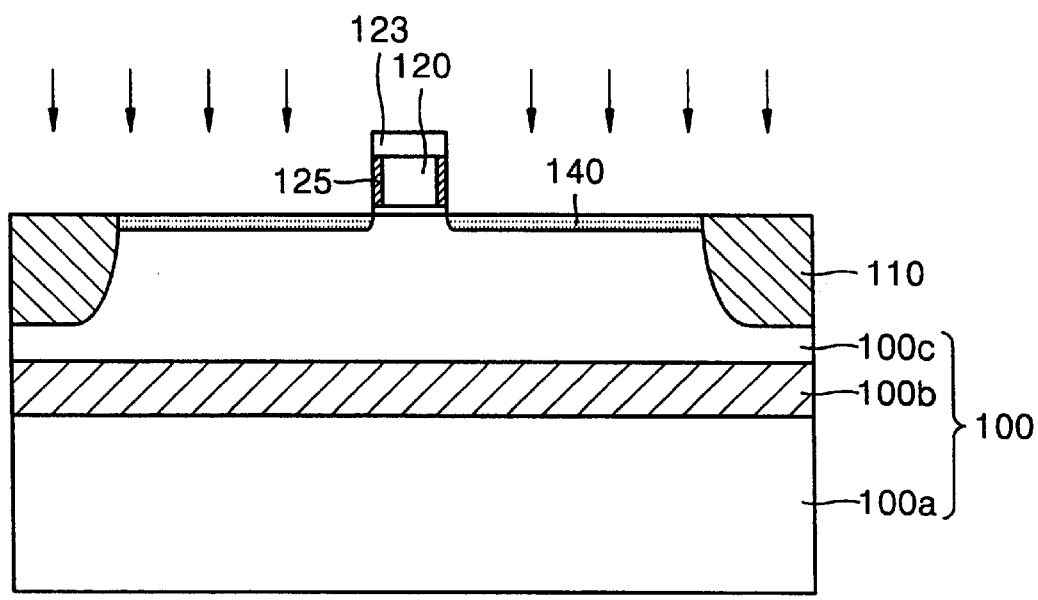

Referring to FIG. 5, as described above, a gate 120 is formed on the semiconductor wafer 100 using photolithography and dry etching. Specifically, photoresist (not shown) is coated on the gate conductive layer 122, and alignment exposure and development are performed on the photoresist to pattern the photoresist. The gate conductive layer 122 is dry-etched using the patterned photoresist as a mask to form the gate 120 comprised of the patterned gate dielectric layer 121 and the patterned gate conductive layer 122. Next, the patterned photoresist is removed by ashing and wet stripping, thus completing the gate 120, as shown in FIG. 5. A channel junction is thinly formed using the gate 120 as an ion implantation mask by implanting ions into the surface of the monocrystalline silicon layer 100c at either side of the gate 120 with a predetermined low energy using an ion implanter. In the case of an NMOS transistor, n-type phosphorus (P) or arsenic (As) can be implanted. In the case of a PMOS transistor, p-type boron (B) can be implanted. The channel junction 140 improves the electrical characteristics of a semiconductor device, such as threshold voltage characteristics.

As described above, after the gate 120 is formed, the gate conductive layer 122 is exposed at the sidewalls of the gate 120. Accordingly, the gate 120 may be damaged by an etchant in a subsequent wet etching process. In addition, if insulating layer spacers 130, which will be described below, are directly formed at the sidewalls of the gate 120 without interposing any layer therebetween, adhesiveness between the gate 120 and the insulating layer spacers 130 may be weak, and accordingly, the gate 120 and the insulating layer spacers 130 may be isolated from each other. Therefore, there is a need to form an oxide layer 125 (for example, a gate poly oxide layer) at the sidewalls of the gate 120 by oxidation in order to improve the characteristics and yield of a semiconductor device.

Figure 6:
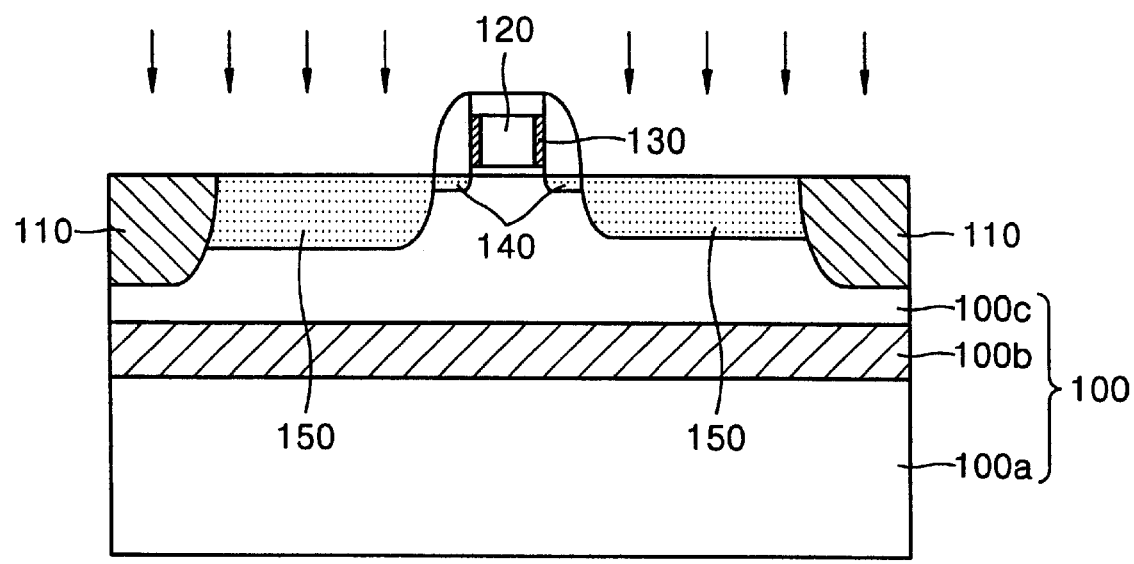

Referring to FIG. 6, an insulating layer (not shown) is deposited on the entire surface of the structure. The insulating layer may be a silicon oxide layer or a silicon nitride layer formed by chemical vapor deposition (CVD). In order to form the insulating layer to have high hardness, the insulating layer is preferably formed of a silicon oxide ($SiO_2$) layer or a silicon nitride layer ($Si_3N_4$) by low pressure chemical vapor deposition (LPCVD). Next, dry etching, which shows high anisotropy, is performed on the entire surface of the structure, on which the insulating layer has been formed, thereby forming the insulating layer spacers at the sidewalls of the gate 120. Accordingly, the length of a gate channel between source and drain junctions 150 and 160 is increased by as much as the thickness of the insulating layer spacers 130, and thus a short channel effect caused by the gate 120 having a small length can be prevented.

Next, the source and drain junctions 150 and 160 are asymmetrically formed in NMOS or PMOS source and drain regions, respectively, which are arranged at either side of the gate 120 on the surface of the semiconductor wafer 100. In order to form the source and drain junctions 150 and 160 in NMOS source and drain regions, respectively, of the SOI wafer 100, PMOS regions of the SOI wafer 100 are covered with photoresist, and ions of an element having five valence electrons, such as arsenic (As), phosphorus (P), or antimony (Sb), are implanted into the NMOS source and drain regions using the gate 120 and the insulating layer spacers 130 in NMOS regions as ion implantation masks. Next, the photoresist covering the PMOS regions is removed. Next, only the NMOS regions are covered with photoresist, and then ions of an element having three valence electrons, such as boron (B) or $BF_2$, are implanted into PMOS source and drain regions using the gate 120 and the insulating layer spacers 130 in the PMOS regions as ion implantation masks. Next, the photoresist used as an ion implantation mask is completely removed by ashing and wet cleaning.

Figure 7:
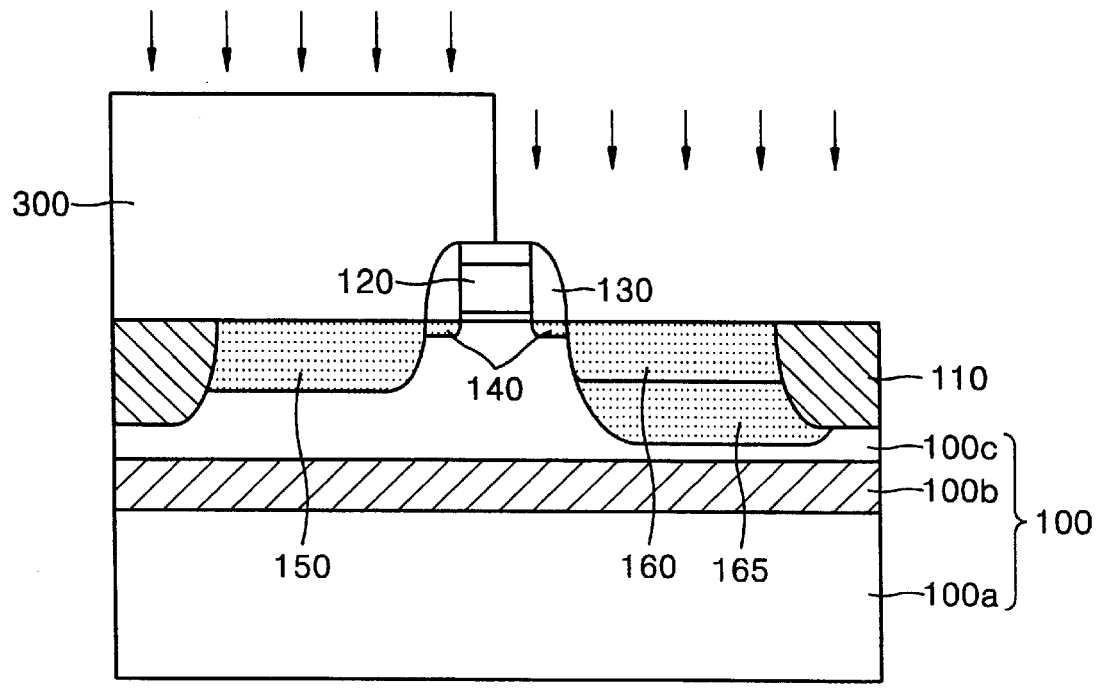

Referring to FIG. 7, photoresist 300 is deposited to cover a source region but expose a drain region, ions are implanted into the exposed drain region with an energy higher than the energy applied to form the drain junction 160 through ion implantation, thereby forming a reinforced drain region 165 under the drain junction 160. Here, phosphorus (P) is implanted to form the reinforced drain junction 165 in an NMOS region, and boron (B) is implanted to form the reinforced drain junction 165 in a PMOS region. The reinforced drain junction 165 can prevent latch-up from occurring among adjacent devices. Accordingly, the source junction 150 is formed in a source region, and a deep drain junction including the drain junction 160 and the reinforced drain junction 165 is formed to reach the lower portion of the insulating layer 110, and thus a semiconductor device having the source and drain junctions 150 and 160 formed to be asymmetrical is formed. Therefore, the deep drain junction 160 and 165 can prevent latch-up from occurring among adjacent devices, a ground region having an enlarged area is formed under the source junction 150. Accordingly, it is possible to stably discharge electric charges integrated in a region, on which devices will be formed, and thus provide a semiconductor device having superior electrical characteristics.

Figure 8:
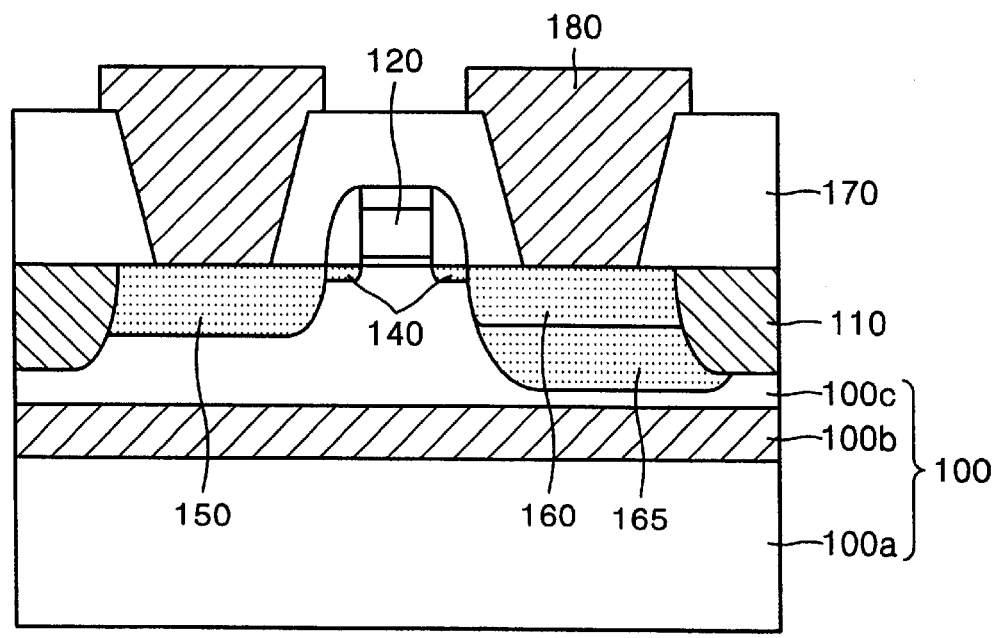

Referring to FIG. 8, after the formation of a transistor having the source and drain junctions 150 and 160 is completed, an interlayer dielectric layer 170 is formed on the semiconductor wafer 100. In a case where a semiconductor device desired to be formed is a dynamic access random memory (DRAM), a process of forming a capacitor is further performed. In a case where the semiconductor device to be formed is a general logic product, a process of manufacturing metal wiring layers to form a contact 175 and a metal wiring layer 180 is further performed.

As described above, in the method for manufacturing a semiconductor device on a SOI wafer according to the present invention, since a source junction and a drain junction are formed to be asymmetrical, it is possible to prevent latch-up, which may occur among devices formed on a semiconductor wafer, and solve an internal charging problem with the prior art. Thus, it is possible to provide a stable MOS transistor having high reliability.

Figure 9:
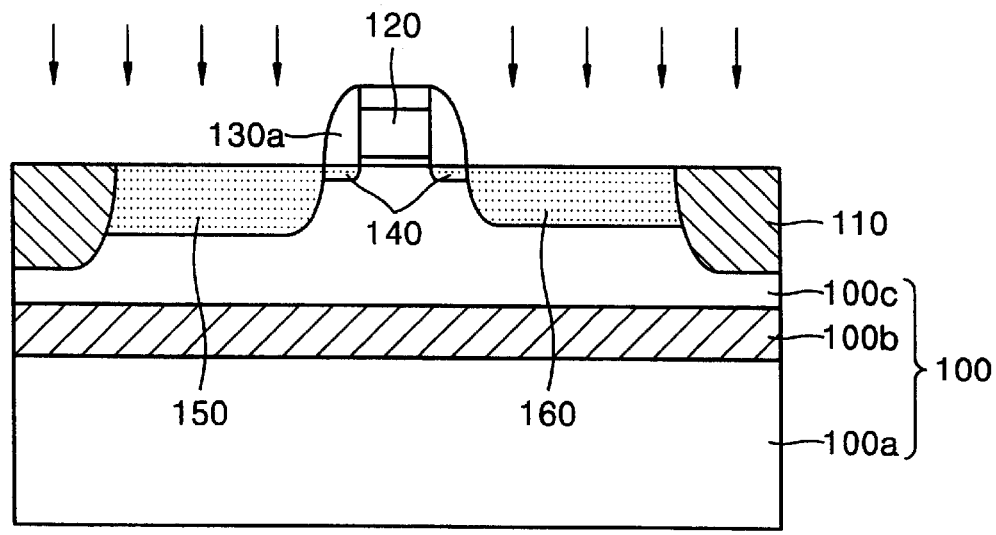
FIGS. 9 through 11 are cross-sectional views illustrating a method for manufacturing a semiconductor device according to a second embodiment of the present invention.
Figure 10:
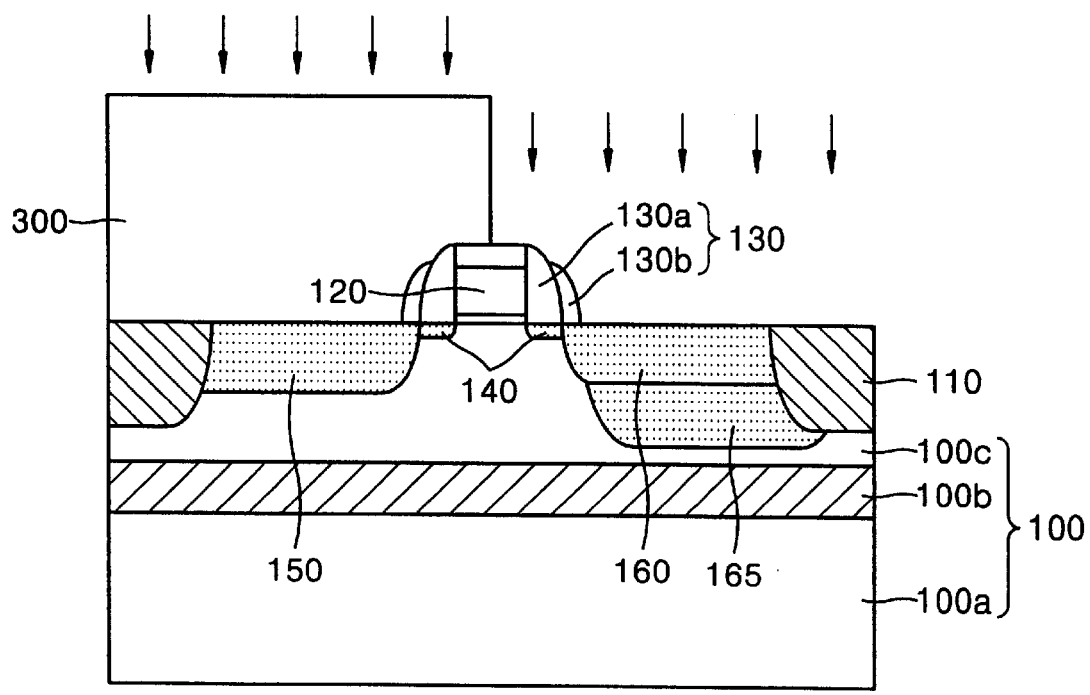
Figure 11:
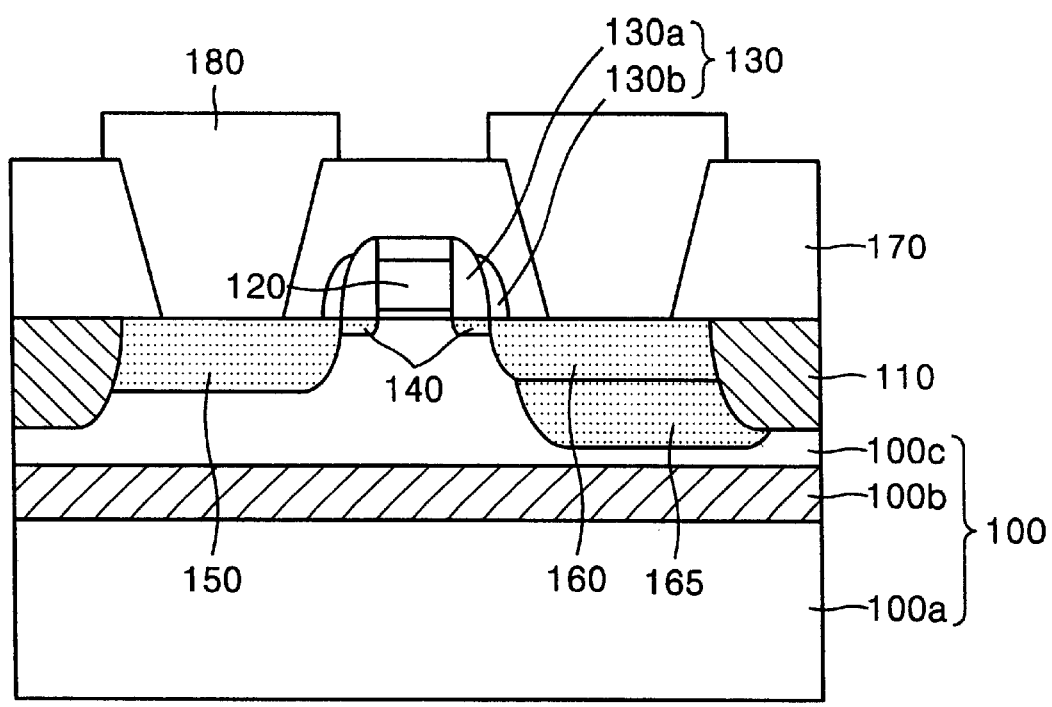

FIGS. 9 through 11 are cross-sectional views illustrating a method for manufacturing a semiconductor device on a SOI wafer according to a second embodiment of the present invention. In the second embodiment, processes of forming an insulating layer, a gate 120 comprised of a gate conductive layer 122 and a gate dielectric layer 121, and a channel junction 140 are the same as the corresponding processes of the first embodiment.

Referring to FIG. 9, first insulating spacers 130a are formed at the sidewalls of the gate 120. In order to implant ions in a PMOS region and an NMOS region separately, ions are implanted into the surface of the monocrystalline layer 100a at either side of the gate 120 in one of the PMOS and NMOS regions using the first insulating layer spacers 130a as ion implantation masks after covering the other of the PMOS and NMOS regions with photoresist. As a result of the ion implantation, a source junction 150 and a drain junction 160 are formed. Here, ions of an element having five valence electrons, such as phosphorus (P), arsenic (As), or antimony (Sb), are implanted into source and drain regions in an NMOS region, and ions of an element having three valence electrons, such as boron (B) or $BF_2$, are implanted into source and drain regions in a PMOS region. Since the source and drain junctions 150 and 160 are formed to be relatively shallow, the ion implantation must be performed with a very low energy, for example, with an energy of 10–30 KeV.

Next, referring to FIG. 10, second insulating layer spacers 130b are formed at the sidewalls of the first insulating layer spacers 130a. An insulating layer (not shown) is deposited to a predetermined thickness on the entire surface of the SOI wafer 100. The insulating layer may be a silicon oxide layer or a silicon nitride layer formed by chemical vapor deposition (CVD). Next, the insulating layer is dry-etched to form the second insulating layer spacers 130b at the sidewalls of the first insulating layer spacers 130a, as shown in FIG. 9. Since the second insulating layer spacers 130b are formed to extend from the surface of the first insulating layer spacers 130a by a predetermined width, a reinforced drain region 165, which will be described below, is formed to be moved toward the isolation layer 110 by as much as the predetermined width. In addition, a region under the gate 120, at which a channel will be formed, is enlarged, thus increasing the area of a ground in an active region, on which devices will be formed.

After forming the second insulating layer spacers 130b, ions are implanted into only the drain region, in which the drain junction 160 has been formed, thereby forming the reinforced drain junction 165 extending from the lower portion of the drain junction 160. Specifically, photoresist 300 is deposited to cover the source region but expose only the drain region, thus forming a drain pattern of the photoresist 300. In a case where there is need to expose only a drain region in an NMOS region, a PMOS region must be completely covered with the photoresist 300 along with a source region in the NMOS region. On the other hand, in a case where there is need to expose only a drain region in the PMOS region, the NMOS region must be completely covered with photoresist (not shown) along with the source region in the PMOS region. Next, in the case of implanting ions into the NMOS region using an ion implanter, ions of an n-type element having five valence electrons, such as phosphorus (P) or arsenic (As), are implanted into the drain region using the drain pattern. In particular, in the case of implanting arsenic ions into the source and drain regions to form the source and drain junctions 150 and 160, it is preferable to implant phosphorus (P) ions into the drain region exposed through the photoresist 300. On the other hand, in the case of implanting ions into the PMOS region, ions of a p-type element having three valence electrons, such as boron (B) or $BF_2$, are implanted into the drain region using an ion implanter. Here, in order to form the reinforced drain junction 165 deeper than the drain junction 160, the ion implantation must be performed with an ion implantation energy higher than the ion implantation energy used to form the drain junction 160. After the ion implantation, the semiconductor wafer 100 is heat-treated at a predetermined temperature to activate ions implanted into the reinforced drain region 165. Here, the semiconductor wafer 100 may be heat-treated by a rapid thermal process, in which the temperature of the surface of the semiconductor wafer 100 can be rapidly heated using radiant light emitted from a lamp. Since the rapid thermal process does not require an additional heat treatment (for example, ramping-up or ramping-down) except for the heat treatment necessary to activate the ions implanted into the reinforced drain region 165, it can be more effective to form a very shallow junction in a highly integrated device. According to the characteristics of a semiconductor device to be formed, the rapid thermal process may be performed every time ion implantation is performed to form a junction or may be performed only one time after all ion implantation processes are completed.

As described above, if the source and drain junctions 150 and 160 of a MOS transistor are asymmetrically formed in the monocrystalline silicon layer 100c in the semiconductor device on a SOI wafer according to the present invention, that is, if the source junction 150 is formed to be shallow and the drain junction 160 is formed to extend to the lower portion of the insulating layer 110, a sufficient area for a ground is prepared in the monocrystalline silicon layer 100c, through which electric charges can be discharged to a ground, and thus improve the electrical characteristics of a MOS transistor, such as threshold voltage $V_t$.

In the method for manufacturing a semiconductor device on a SOI wafer according to the first embodiment of the present invention, ions used to asymmetrically form the source and drain junctions 150 and 160 may be implanted into source and drain regions at the same time or may be independently implanted into the source and drain regions using a photoresist mask. The source and drain junctions 150 and 160 may be asymmetrically formed at either side of the gate 120. That is, a drain region is covered with photoresist by photolithography to expose only a source region, and then impurity ions are implanted into the source region with a low energy to form the source junction 150. The source region is covered with photoresist, and then ions are implanted into the drain region to form the drain junction 160. Here, the ions implanted to form the drain junction 160 are of the same conductivity as the ions implanted to form the source junction 150. For example, in a case where the source junction 150 is n-type, the drain junction 160 is also n-type. In addition, the drain junction 160 is formed by implanting ions into the drain region with a much higher energy than the energy applied to implant ions to form the source junction 150 so that the drain junction 160 is formed to diffuse into the lower portion of the insulating layer 110. Next, the resulting structure is heat-treated so that the source junction 150 of FIG. 1, which is relatively shallow, can be formed in the source region and the drain junction 160 of FIG. 1, which is relatively deep, can be formed in the drain region.

An asymmetrical drain junction 160 and 165 may be formed by multi-step ion implantation, which involves a step of implanting ions into a drain region to form the drain junction 160 having the same depth as the source junction 150, in a state where a source region is covered with photoresist, and a step of implanting ions into the drain junction 160 with a higher ion implantation energy to form the reinforced drain junction 165 under the drain junction 150.

As described above, the semiconductor device on a SOI wafer includes source and drain junctions asymmetrically formed to have different depths at either side of a gate, and thus sufficient ground area is obtained to solve the problem of an unstable ground. Accordingly, the electrical characteristics of the semiconductor device on a SOI wafer are improved considerably.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A semiconductor device on a silicon-on-insulator (SOI) comprising:
   a semiconductor wafer having a SOI structure and including an insulating layer having a predetermined thickness and a monocrystalline silicon layer formed on the insulating layer;
   an isolation insulating layer formed on the insulating layer on the semiconductor wafer;
   a gate comprised of a gate dielectric layer and a gate conductive layer, which are sequentially stacked on the monocrystalline silicon layer;
   insulating layer spacers formed at the sidewalls of the gate; and
   a source junction and a drain junction asymmetrically formed at either side of the gate between the isolation insulating layer spacers and the insulating layer, the drain junction being coupled to a reinforced drain junction which extends under the drain junction into the isolation insulating layer to a depth that is deeper than the source junction and the drain junction.

2. The semiconductor device of claim 1, wherein the isolation insulating layer includes a silicon oxide layer.

3. The semiconductor device of claim 1, wherein the isolation insulating layer is a silicon oxide layer formed to fill a trench on the semiconductor wafer.

4. The semiconductor device of claim 1, wherein the gate conductive layer is formed of conductive polysilicon.

5. The semiconductor device of claim 4, wherein the gate conductive layer further includes a silicide layer.

6. The semiconductor device of claim 1, wherein the gate dielectric layer is one of a thin silicon oxide layer and a thin silicon oxynitride (SiON) layer.

7. The semiconductor device of claim 1, wherein the insulating layer spacers are formed of a silicon nitride layer.

8. The semiconductor device of claim 1, wherein the source and drain junctions are doped with at least one of a p-type element and an n-type element implanted into the monocrystalline silicon layer.

9. The semiconductor device of claim 8, wherein the drain junction is formed to extend to the lower portion of the isolation insulating layer.

10. The semiconductor device of claim 1, wherein the drain junction further includes a reinforced drain junction, which is formed under the drain junction.

11. The semiconductor device of claim 10, wherein the reinforced drain junction is doped with an element of the same conductivity as the element used to dope the drain junction and is formed to extend to the lower portion of the isolation insulating layer.

12. The semiconductor device of claim 1, further comprising a channel junction formed at the surface of the monocrystalline layer at either side of the gate.

13. A semiconductor device on a SOI comprising:
    a semiconductor wafer having a SOI structure and including an insulating layer having a predetermined thickness and a monocrystalline silicon layer formed on the insulating layer;
    an isolation insulating layer formed in the monocrystalline silicon layer;
    a gate comprised of a gate dielectric layer and a gate conductive layer, which are sequentially stacked on the monocrystalline silicon layer;
    first insulating layer spacers formed at the sidewalls of the gate;
    second insulating layer spacers formed at the sidewalls of the first insulating layer spacers;
    a source junction and a drain junction formed at either side of the gate between the first insulating layer spacers and the isolation insulating layer; and
    a reinforced drain junction formed between the second insulating layer spacers and the isolation insulating layer to extend from the lower portion of drain junction into the isolation insulating layer to a depth that is deeper than the source junction and the drain junction.

14. The semiconductor device of claim 13, wherein the isolation insulating layer includes a silicon oxide layer.

15. The semiconductor device of claim 13, wherein the isolation insulating layer is formed by depositing a silicon oxide layer to fill a trench on the semiconductor wafer.

16. The semiconductor device of claim 13, wherein the gate conductive layer includes at least one of a conductive polysilicon layer and a silicide layer.

17. The semiconductor device of claim 13, wherein the gate dielectric layer is formed of at least one of a thin silicon oxide layer and a thin silicon oxynitride layer.

18. The semiconductor device of claim 13, wherein the first insulating layer spacers are formed of a silicon nitride layer.

19. The semiconductor device of claim 13, wherein the source and drain junctions are doped with one of a p-type element and an n-type element implanted into the monocrystalline silicon layer.

20. The semiconductor device of claim 13, wherein the reinforced drain junction is doped with an element of the same conductivity as the element used to dope the drain junction and is formed to extend to the lower portion of the isolation insulating layer.

21. The semiconductor device of claim 13, further comprising a channel junction formed at the surface of the monocrystalline layer at either side of the gate.

* * * * *